United States Patent [19]
Kim

[11] Patent Number: 5,898,700
[45] Date of Patent: *Apr. 27, 1999

[54] TEST SIGNAL GENERATOR AND METHOD FOR TESTING A SEMICONDUCTOR WAFER HAVING A PLURALITY OF MEMORY CHIPS

[75] Inventor: Chul-Soo Kim, Kyungki-do, Rep. of Korea

[73] Assignee: Samsung Electronics, Co., Ltd., Suwon, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/748,211

[22] Filed: Nov. 12, 1996

[30] Foreign Application Priority Data

Nov. 16, 1995 [KR] Rep. of Korea ................... 1995/41668

[51] Int. Cl.$^6$ .................................................. G01R 31/28
[52] U.S. Cl. ........................................... 371/21.1; 324/765
[58] Field of Search ................................. 371/21.1, 21.4, 371/22.5, 68.1, 27.5, 28; 365/201; 324/763, 765, 73.1, 500, 507; 364/550, 483, 481, 490; 327/566; 395/183.06

[56] References Cited

U.S. PATENT DOCUMENTS

| 5,386,127 | 1/1995 | Furuyama | 257/48 |
|---|---|---|---|
| 5,412,258 | 5/1995 | Ogawa et al. | 327/170 |
| 5,412,337 | 5/1995 | Kumakura | 327/566 |
| 5,471,480 | 11/1995 | You | 371/21.2 |
| 5,539,325 | 7/1996 | Rostoker et al. | 324/763 |
| 5,638,331 | 6/1997 | Cha et al. | 365/201 |
| 5,657,284 | 8/1997 | Beffa | 365/201 |
| 5,661,407 | 8/1997 | Shibata | 324/763 |
| 5,694,050 | 12/1997 | Noguchi | 324/765 |

*Primary Examiner*—Robert W. Beausoliel, Jr.
*Assistant Examiner*—Nadeem Iqbal
*Attorney, Agent, or Firm*—Marger Johnson & McCollom, P.C.

[57] ABSTRACT

A test signal generator and method for testing a semiconductor wafer having a plurality of memory chips. A plurality of input buffers buffer test timing signals applied through a plurality of input terminals to the memory chips in test mode. A direct current source supplies a direct current of a given level to each of the terminals. The direct current source comprises a MOS transistor for supplying the direct current including a fuse with a first node connected between the terminal and buffer and a second node for receiving the direct current. The fuse is cut by an electric or laser cutter after wafer testing is complete. This enables a probe card for performing the wafer testing to be fabricated with a reduced number of probe tips, thereby overcoming the limitation of a test driver and allowing the simultaneous testing of semiconductor wafers having a plurality of memory chips having different pad configurations.

10 Claims, 2 Drawing Sheets

TEST SIGNAL GENERATOR AND METHOD FOR TESTING A SEMICONDUCTOR WAFER HAVING A PLURALITY OF MEMORY CHIPS

BACKGROUND OF THE INVENTION

This invention relates generally to semiconductor wafer testing and more particularly to a test signal generator and method for testing a semiconductor wafer having a plurality of memory chips.

Semiconductor memory devices, such as dynamic random access memory (DRAM) and static random access memory (SRAM) devices, are integrated circuit (IC) chips fabricated on a semiconductor wafer. During the manufacturing process, these devices are subjected to various tests to ensure their reliability.

Memory device reliability tests are generally classified into either a wafer test performed before chip packaging or a package test performed after packaging. Both forms of testing are well-known in the field. The wafer test employs a simple test pattern to check whether the memory cells and peripheral circuits in each chip are working normally. The package test checks the internal circuitry of each chip against the fundamental timing signals represented in the memory specification and other signals to ascertain whether the chip passes or fails.

Test coverage and testing time are important factors to be considered in satisfactorily performing these tests. Test coverage is related to the reliability of the memory device and the testing time to the yield rate of production. Moreover, testing time increases with the level of integration of the chip and thereby causes an increase in overall production time and chip costs.

To this end, there has been proposed a multi-chip test method which simultaneously tests all of the memory chips on a semiconductor wafer. However, for testing high speed, large scale semiconductor memory devices which each support various functions including multiple data input/output terminals, e.g., multiple DQ, X16, X32 terminals, and multiple function signal input/output terminals, the method is limited by the number of available pins. Consequently, when testing a semiconductor wafer having a plurality of memory chips using this multi-chip test method, the test can only drive the available pins and the number of memory chips tested is thereby reduced.

Referring to FIG. 1, a block diagram of a prior art conventional test signal generator using the multi-chip test method for supplying a test signal to a semiconductor wafer is shown. Normally, to perform the wafer test, the pads for each memory chip to which such functional pins will be connected must be supplied with a direct current signal of a level through the tip on a probe card or the contact pins of a membrane card. Test timing signals for a test pattern are set to a direct current of a logic "high" or "low," such as the source or ground voltage level. These signals do not operate as row or column strobe signals, rather they are applied to the pad (or pins) defining the specific functions of the memory chip. For example, a typical eight megabyte synchronous graphic DRAM has functional pins, such as DQM, DSF (Define Special Function), CKE and so on, which are configured to receive an input signal of logic "high" or "low."

As show in FIG. 1, a memory chip 10, one of a plurality of memory chips fabricated on a semiconductor wafer (not shown), includes a pad 14 for receiving a test timing signal of logic "low" or "high" during a wafer test to establish the operational modes of the peripheral circuits of the chip. A probe tip on a probe card 12 supplies a direct current of a logic "high" or "low" to the pad 14 of the chip. When performing the wafer test, the probe tips on the probe card 12 are supplied with the direct current at the desired level. This is to maintain the pads at a the desired voltage level to test the operational states of the internal circuits of the memory chips on the semiconductor wafer. The pad 14 is also connected through a signal line to an input buffer 16 for transferring the input signal to the internal circuits of the memory chip 10.

The probe card 12 and wafer are paired to perform the test with the desired test pattern. The probe card 12 has a fixed number of tips corresponding to the total number of pads on the memory chips 10 fabricated on the semiconductor wafer. Consequently, due to its fixed number of tips, the probe card 12 is unusable for testing other wafers having more pads.

Therefore, what is needed is a memory device test signal generator for testing semiconductor wafers comprising memory chips having different pad configurations.

SUMMARY OF THE INVENTION

It is, therefore, an object of the present invention to provide a test signal generator for efficiently testing a semiconductor wafer having a plurality of memory chips in a short amount of time. Such a test signal generator should reduce the testing time without adversely affecting the test coverage.

It is a further object of the present invention to provide a test signal generator for testing a semiconductor wafer having a plurality of memory chips which include wafer test signal generators to improve the wafer testing efficiency and the yield rate.

The invention is a test signal generator for testing a semiconductor wafer having a plurality of memory chips. A plurality of input buffers buffer test timing signals applied through a plurality of input terminals to the memory chips in test mode. A direct current source supplies a direct current of a given level to each of the terminals. The direct current source comprises a MOS transistor for supplying the direct current including a fuse with a first node connected between the terminal and buffer and a second node for receiving the direct current. The fuse is cut by an electric or laser cutter or similar means after the wafer testing is complete.

The foregoing and other objects, features and advantages of the invention will become more readily apparent from the following detailed description of preferred embodiments of the invention which proceeds with reference to the accompanying drawings.

DETAILED DESCRIPTION

Figure 1:
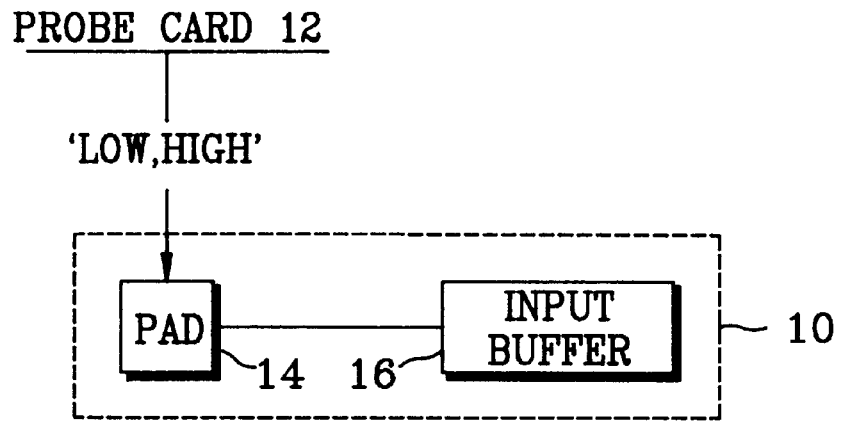
FIG. 1 is a block diagram illustrating a prior art conventional test signal generator for supplying a test signal to a semiconductor wafer.
Figure 2:
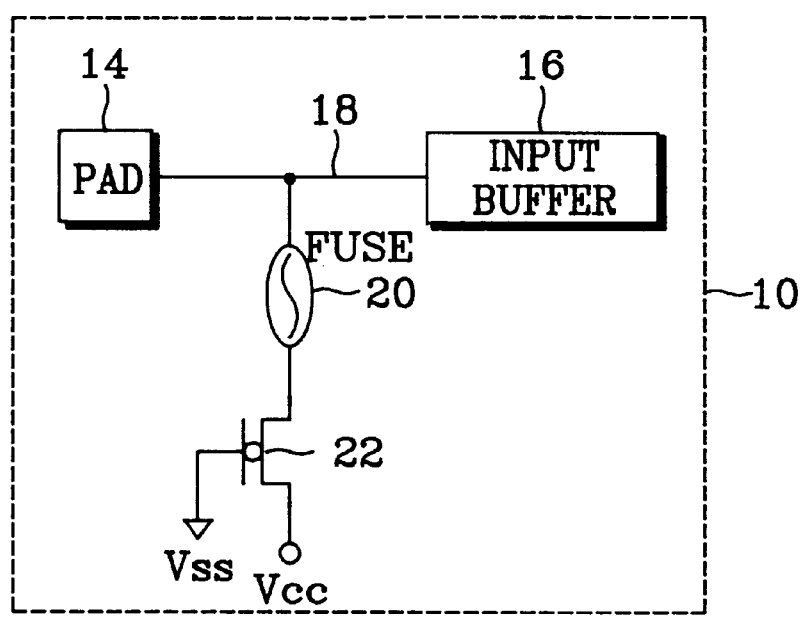
FIG. 2 is a block diagram illustrating one of the memory chips fabricated on a semiconductor wafer for testing by a test signal generator constructed according to an embodiment of the present invention.

Referring to FIG. 2, a block diagram illustrating one of a plurality of memory chips 10 fabricated on a semiconductor wafer (not shown) for testing by a test signal generator constructed according to an embodiment of the present invention is shown. A pad 14 of one of the memory chips 10 is supplied with a voltage source set to a logic level of "high" as a test timing signal. The pad 14 is also called a "terminal" to which is connected an external pin by means of wire bonding when packaged. The pad 14 is connected through a signal transmission line 18 to an input buffer 16 for supplying the input signal to the internal circuits of the chip. The wafer test signal generator includes a fuse 20 and a PMOS transistor 22 connected between the transmission line 18 and a voltage source $V_{cc}$. The fuse is connected in series to the drain and source of the transistor. The gate of the PMOS transistor 22 is connected to a ground voltage $V_{ss}$. The same construction is applied to all the pads 14 of the memory chips 10 for maintaining a desired voltage level during wafer testing.

To perform the wafer test, a power supplying probe tip on the probe card (not shown) is connected to the power input pad 14 of the memory chip 10 for supplying the source voltage $V_{cc}$ and ground voltage $V_{ss}$. The PMOS transistor 22 is then turned on using the gate connected to the ground voltage $V_{ss}$ so as to apply the source voltage $V_{cc}$ from a source through the fuse 20 to the signal transmission line 18 so that the input buffer 16 transfers the source voltage $V_{cc}$ to the internal circuits of the memory chip 10. Thus, it is unnecessary for the probe card to supply a direct current to the pad 14 for performing the wafer test. Later, for performing the package test, the fuse 20 is cut off by using an electric or laser cutter to supply the timing signals specified for the memory chip 10 to the pad 14. Thus, the number of memory chips 10 which can be simultaneously tested can be increased independently from the number of probe tips on the probe card.

Figure 3:
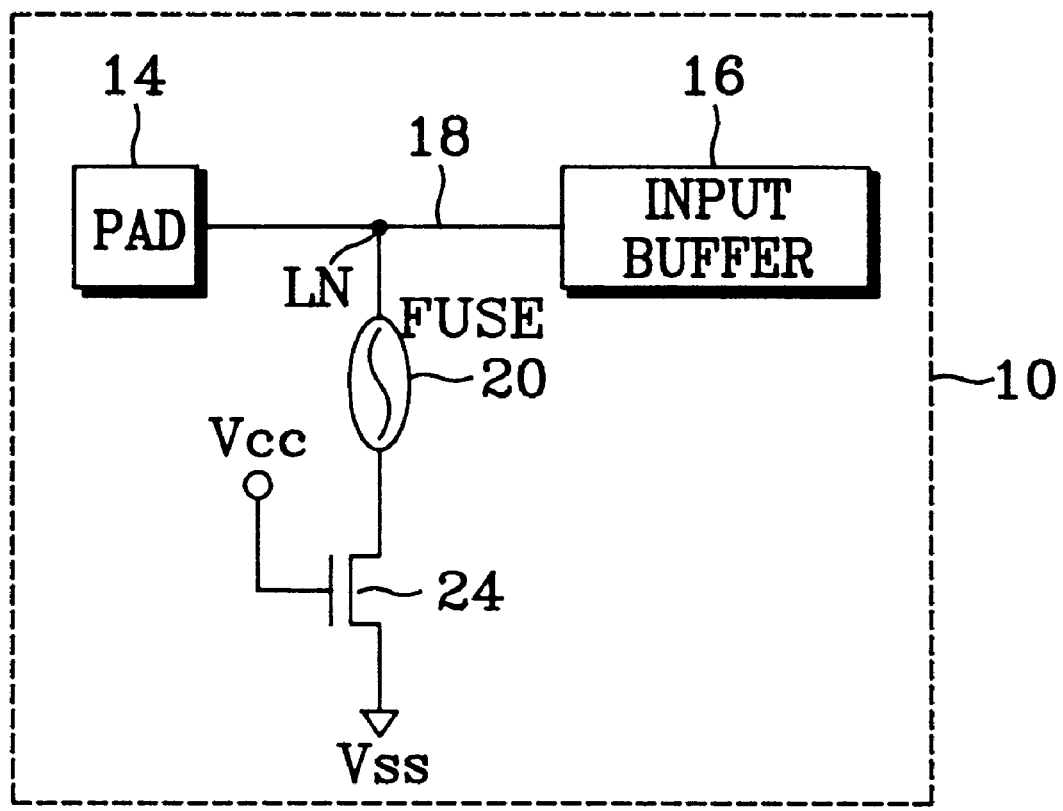
FIG. 3 is a block diagram illustrating one of the memory chips fabricated on a semiconductor wafer for testing by a test signal generator constructed according to a further embodiment of the present invention.

Referring to FIG. 3, a further embodiment of the present invention is shown. The pad 14 of the memory chip 10 is maintained at the "low" level of the ground voltage $V_{ss}$ during the wafer test. This further embodiment uses an NMOS transistor 24 instead of the PMOS transistor 22. The drain of the NMOS transistor 24 is connected to the other end of the fuse 20, the source to the ground voltage $V_{ss}$ and the gate to the voltage source $V_{cc}$. When performing the wafer test, the pad 14 is maintained at a logic "low" level by the ground voltage $V_{ss}$ applied through the fuse 20.

Thus, the present invention provides a semiconductor wafer test signal generator for automatically maintaining the pads of the memory chips at a test level voltage. Accordingly, the probe card can be fabricated with a reduced number of probe tips, thereby overcoming the limitation of a test driver and performing simultaneous testing of more memory chips.

Having described and illustrated the principles of the invention in preferred embodiments thereof, it should be apparent that the invention can be modified in arrangement and detail without departing from such principles. I claim all modifications and variations coming within the spirit and scope of the following claims.

I claim:

1. A test signal generator for testing a semiconductor wafer having a plurality of memory chips, comprising:

a plurality of input buffers for buffering the test timing signals applied through a plurality of input terminals to said memory chips in a test mode; and a direct current source coupled to first and second power supply rails of each memory chips for supplying a direct current of a given level to each of said terminals, wherein the direct current source is directly coupled to each of said input terminals; and wherein said direct source comprises a MOS transistor for supplying said direct current, and wherein a gate of MOS transistor is coupled to the first power supply rail and a source of the MOS transistor is coupled to the second power supply rail, and a fuse with a first node directly connected to said terminal and a second node coupled to a drain of the MOS transistor.

2. A test signal generator according to claim 1, wherein said fuse is cut by means of electricity or laser after wafer testing.

3. A test signal generator according to claim 1, wherein said direct current source is connected with a voltage source.

4. A test signal generator for testing a semiconductor wafer having a plurality of memory chips, comprising:

a plurality of input buffers for buffering test timing signals applied through a plurality of input terminals to said memory chips in a test mode;

a fuse with one end connected to a transmission line connecting each of said input terminals and a corresponding one of said buffers; and a PMOS transistor including a gate connected to a ground voltage, a source connected to a voltage source and a drain to the other end of said fuse, whereby a voltage level of said input terminal is maintained at a level of said voltage source through said fuse when said source voltage and said ground voltage are applied to the memory chip.

5. A test signal generator according to claim 4, wherein said fuse is cut by means of electricity or laser after wafer testing.

6. A test signal generator for testing a semiconductor wafer having a plurality of memory chips, comprising:

a plurality of input buffers for buffering test timing signals applied through a plurality of input terminals to said memory chips in a test mode;

a fuse with one end connected to a transmission line connecting each of said input terminals and a corresponding one of said buffers; and an NMOS transistor including a gate connected to a voltage source, a drain connected to a ground voltage and a source connected to the other end of said fuse, whereby a voltage level of said input terminal is maintained at the ground voltage through said fuse when said source voltage and said ground voltage are applied to the memory chip.

7. A test signal generator according to claim 6, wherein said fuse is cut by means of electricity or laser after the wafer testing.

8. A method for testing a semiconductor wafer having a plurality of memory chips, comprising the steps of:

associating an input buffer with each of a plurality of input terminals to said memory chips;

connecting a test timing signal source to each said input buffer for wafer testing; and supplying a direct current of a given level, responsive to a supply voltage, as a test signal directly to each of said terminals over a transmission line from said test timing signal source;

wherein the test timing signal source is a wafer test signal generator, the step of connecting a test timing signal source further comprising connecting the wafer test signal generator to each said input buffer, and further comprising the step of forming the wafer test signal generator from a fuse and a PMOS transistor.

9. A method according to claim 8, further comprising connecting said wafer test signal generator to a voltage source.

10. A method according to claim 9, further comprising the step of cutting said fuse using means of electricity or laser after completion of said wafer testing.

* * * * *